US008071277B2

(12) United States Patent
Porque

(10) Patent No.: US 8,071,277 B2
(45) Date of Patent: Dec. 6, 2011

(54) METHOD AND SYSTEM FOR FABRICATING THREE-DIMENSIONAL STRUCTURES WITH SUB-MICRON AND MICRON FEATURES

(75) Inventor: Jerome C. Porque, Bridgewater, NJ (US)

(73) Assignee: 3M Innovative Properties Company, St. Paul, MN (US)

( * ) Notice: Subject to any disclaimer, the term of this patent is extended or adjusted under 35 U.S.C. 154(b) by 573 days.

(21) Appl. No.: 12/325,659

(22) Filed: Dec. 1, 2008

(65) Prior Publication Data
US 2009/0162799 A1    Jun. 25, 2009

Related U.S. Application Data

(60) Provisional application No. 61/016,008, filed on Dec. 21, 2007.

(51) Int. Cl.
*G03F 7/26* (2006.01)
(52) U.S. Cl. ...................................................... 430/325
(58) Field of Classification Search .................. 430/324, 430/325
See application file for complete search history.

(56) References Cited

U.S. PATENT DOCUMENTS

| | | | |
|---|---|---|---|
| 5,425,848 A | 6/1995 | Haisma et al. |
| 5,851,674 A | 12/1998 | Pellerite et al. |
| 6,696,157 B1 | 2/2004 | David et al. |
| 6,824,882 B2 | 11/2004 | Boardman et al. |
| 6,849,558 B2 | 2/2005 | Schaper |
| 7,173,778 B2 | 2/2007 | Jing et al. |
| 7,229,868 B2 | 6/2007 | Bernds et al. |
| 2005/0048288 A1 | 3/2005 | Flynn et al. |
| 2005/0124712 A1 | 6/2005 | Anderson et al. |
| 2006/0286488 A1 | 12/2006 | Rogers et al. |
| 2007/0003876 A1 | 1/2007 | Schilling et al. |
| 2008/0315459 A1 | 12/2008 | Zhang et al. |

OTHER PUBLICATIONS

Brinker, C.J. & Scherer, G.W.; *Sol-Gel Science*; Academic Press, NY; pp. 501-505 (1990).
Michel, B. et al., "Printing Meets Lithography: Soft Approaches to High-resolution Patterning," *IBM Journal of Research & Development* (Sep. 2001); vol. 45, No. 5; pp. 697-719.
Fiegel, A. et al., "Scalable Interference Lithography Alignment for Fabrication of Three-Dimensional Photonic Crystals," *Optics Letters* (May 1, 2002); vol. 27, No. 9; pp. 746-748.
Serbin, J. et al., "Three-Dimensional Nanostructuring of Hybrid Materials by Two-Photon Polymerization," *Proceedings of SPIE, the Int. Soc. Opt. Eng.* (2003); vol. 5222, No. 1; pp. 171-177.
Tanaka, Y. et al., "Theoretical Investigation of a Two-Dimensional Photonic Crystal Slab with Truncated Cone Air Holes," *Applied Physics Letters* (Mar. 17, 2003); vol. 82, No. 11; pp. 1661-1663.

(Continued)

*Primary Examiner* — Cynthia Kelly
*Assistant Examiner* — Caleen Sullivan
(74) *Attorney, Agent, or Firm* — Gregg H. Rosenblatt

(57) ABSTRACT

A method and system are provided for fabricating three-dimensional (3D) structures having micron or submicron features. The method includes providing a continuously-formed relief structured material, the relief structured material having a first layer comprising a material having a pattern of relief structures formed on a first surface thereof. The structured material includes second layer comprising a photosensitive material that is disposed on the first layer. The relief structured material is exposed to radiation through the first layer, where the pattern of relief structures formed on the first surface of the first layer generates a 3-dimensional light intensity pattern of the radiation that is incident on the second layer. The exposed material is developed, where the developed material comprises a plurality of 3D structures having micron or submicron features.

10 Claims, 4 Drawing Sheets

OTHER PUBLICATIONS

Divliansky, I. et al., "Fabrication of Three-Dimensional Polymer Photonic Crystal Structures Using Single Diffraction Element Interference Lithography," *Applied Physics Letters* (Mar. 17, 2003); vol. 82, No. 11; pp. 1667-1669.

Ullal, C.K. et al., "Triply Periodic Bicontinuous Structures Through Interference Lithography: A Level-Set Approach," *Journal Optical Society America A* (May 2003); vol. 20, No. 5; pp. 948-954.

Prather, D.W. et al., "Fabrication of Three-Dimensional Photonic Crystals Using Lithographic Processes," *Proceedings of SPIE, the Int. Soc. Opt. Eng.* (2004); vol. 5347, No. 1; pp. 224-232.

Jeon, S. et al., "Fabricating Complex Three-Dimensional Nanostructures with High-Resolution Conformable Phase Masks," *Proceedings of the National Academy of Sciences of the USA* (Aug. 24, 2004); vol. 101, No. 34; pp. 12428-12433.

Mizeikis, V. et al., "Three-Dimensional Woodpile Photonic Crystal Templates for the Infrared Spectral Range", *Optics Letters* (Sep. 1, 2004); vol. 29, No. 17; pp. 2061-2063.

Meisel, D.C. et al., "Three-Dimensional Photonic Crystals by Holographic Lithography Using the Umbrella Configuration: Symmetries and Complete Photonic Band Gaps", *Physical Review B* (Oct. 13, 2004); vol. 70; pp. 165104-1 to 165104-9.

Zanke, C. et al., "Large-Area Patterning for Photonic Crystals Via Coherent Diffraction Lithography", *Journal of Vacuum Science Technology B* (Nov./Dec. 2004); vol. 22, No. 6; pp. 3352-3355.

Yao, P. et al., "Fabrication of Three-Dimensional Photonic Crystals with Multilayer Photolithography", *Optics Express* (Apr. 4, 2005); vol. 13, No. 7; pp. 2370-2376.

Wu, L. et al., "Fabrication of Large Area Two- and Three-Dimensional Polymer Photonic Crystals Using Single Refracting Prism Holographic Lithography", *Applied Physics Letters* (2005); vol. 86; pp. 241102-1 to 241102-3.

Moon, J.H. and Yang, S., "Creating Three-Dimensional Polymeric Microstructures by Multi-Beam Interference Lithography", *Journal of Macromolecular Science Part C: Polymer Reviews* (2005); vol. 45; pp. 351-373.

Li, E. et al., "Predication of Multi-Dimensional Photonic Crystal Structures Generated by Multi-Beam Interference in Holographic Lithography", *Smart Materials and Structures* (2006); (Institute of Physics Publishing); vol. 15; pp. S158-S164.

Liu, Y. et al., "Fabrication of Three-Dimensional Photonic Crystals with Two-Beam Holographic Lithography", *Applied Optics* (Jan. 20, 2006); vol. 45, No. 3; pp. 480-483.

Chan, T.Y.M. et al., "Photonic Band-Gap Formation by Optical-Phase-Mask Lithography", *Physical Review E* (Apr. 26, 2006); vol. 73; pp. 046610-1 to 046610-11.

Moon, J.H. et al., "Fabricating Three-Dimensional Polymeric Photonic Structures by Multi-Beam Interference Lithography", *Polymers for Advanced Technologies* (2006); vol. 17; pp. 83-93.

10 µm

10 µm

METHOD AND SYSTEM FOR FABRICATING THREE-DIMENSIONAL STRUCTURES WITH SUB-MICRON AND MICRON FEATURES

CROSS REFERENCE TO RELATED APPLICATION

This application claims the benefit of U.S. Provisional Patent Application No. 61/016,008, filed Dec. 21, 2007, the disclosure of which is incorporated by reference herein in its entirety.

BACKGROUND

The present invention relates generally to manufacturing systems and methods. More specifically, the present invention relates to a method and system for fabricating three-dimensional (3D) structures on the micron and submicron scale in a continuous manner.

The demand for new products with more features in smaller areas has resulted in an increasing demand to manufacture smaller features at higher yields. Some conventional techniques for manufacturing periodic structures of three dimensions (also referred to as "3D periodic structures" or, more particularly, "3D periodic nanostructures" where such structures have length, height, and width features in the nanometer regime) are known. By "3D structure" it is meant that the structures can be quasi-periodic in all three dimensions (length, width, and depth). These conventional methods include techniques based on colloidal sedimentation, polymer phase separation, templated growth, fluidic self-assembly, multiple beam interference lithography, multiple exposures of two optical beams and methods based on printing, molding, and writing. Fabrication of 3D periodic structures using a single diffraction element masks have also been demonstrated.

For example, I. Divliansky, et al., "Fabrication of three-dimensional polymer photonic crystal structures using single diffraction element interference lithography", *Appl. Phys. Letters*, Vol. 82, No. 11 (Mar. 17, 2003) describe a four-beam interference pattern that is recorded in a photosensitive polymer via a single diffraction element that has a central opening surrounded by three diffraction gratings positioned 120° relative to one another.

In another conventional approach, S. Jeon et al., "Fabricating complex three-dimensional nanostructures with high-resolution conformable phase masks", *PNAS*, Vol. 101, No. 34, pp. 12428-12433 (Aug. 24, 2004), describe the use of an elastomeric (PDMS) mask to expose a photopolymer film. In this approach, light passing through the phase mask that has features of relief comparable in dimension to the wavelength of the light generates a 3D distribution of intensity that exposes the photopolymer film throughout its thickness. The phase mask utilized includes a conformable, elastomeric phase mask with features of relief that have dimensions comparable to the optical wavelength. The relief structure is brought in conformal contact with the resist surface allowing for high mechanical and fabrication tolerances. The geometry of this intensity pattern depends on the design (i.e., depth and layout of the relief structures and the index of refraction) of the mask and the wavelength, polarization, and coherence of the exposure light.

However, the conventional fabrication methods are not applicable for fabricating large volume and large area structures of micron or sub-micron periodicity. In addition, these conventional fabrication methods referenced do not present the capability of building different types of lattices with ease of fabrication and with fabrication defect control.

SUMMARY

In one aspect of the present invention, a method for fabricating three-dimensional (3D) structures having micron or submicron features includes providing a continuously-formed relief structured material, the relief structured material having a first layer comprising a material having a pattern of relief structures formed on a first surface thereof. The structured material includes second layer comprising a photosensitive material that is disposed on the first layer. The relief structured material is exposed to radiation through the first layer, where the pattern of relief structures formed on the first surface of the first layer generates a 3-dimensional light intensity pattern of the radiation that is incident on the second layer. The exposed material is developed, where the developed material comprises a plurality of 3D structures having micron or submicron features.

In another aspect, a system for continuously fabricating three-dimensional (3D) structures having micron or submicron features, comprises a master drum, having a structured, relief pattern formed thereon. The system includes a multilayer material that includes an optically transparent first layer having a relief pattern formed on a first surface thereof by the master drum, the multilayer material also comprising a second layer comprising a photosensitive material, the second layer disposed on the first layer. The system also includes an exposure source to expose the first layer to radiation to generate a 3-dimensional light intensity pattern of the radiation that is incident on the second layer. The system also includes a development stage to provide post-exposure processing to the continuous relief structured material.

The above summary of the present invention is not intended to describe each illustrated embodiment or every implementation of the present invention. The figures and the detailed description that follows more particularly exemplify these embodiments.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art which fall within the scope of the principals of this invention. The figures may not be drawn to scale. Like reference numbers have been used throughout the figures to denote like parts.

DETAILED DESCRIPTION

The present invention relates to a method and system for the continuous fabrication of 3D structures on the micron and submicron scale. In a preferred aspect, a stack of polymer layers or organic/inorganic composite or inorganic layers is formed on a substrate with at least one of the layers being imprinted continuously and with at least one other layer being photosensitive. The imprinted layer can provide phase mask characteristics as the stack is moved through a light source. A distribution of radiation intensity that exposes the photosensitive layer is thereby generated. The stack can then be developed, generating the 3D structures, with the imprinted layer being dissolved or delaminated.

The 3D structures generated by the method and system described herein can include symmetrical or asymmetrical patterns of micron and submicron (including nano-scale) features. These patterns of features can have a controlled density as a function of depth. In addition, the 3D structures can include a plurality of defect sites. As described herein, the dynamic method and system provides continuous fabrication of 3D structured materials with micron and submicron periodicity or quasi-periodicity, where the micron and submicron structures can be made much larger than the original relief structure and exposure source dimensions. These structures can be generated with high fabrication tolerances.

Figure 1:
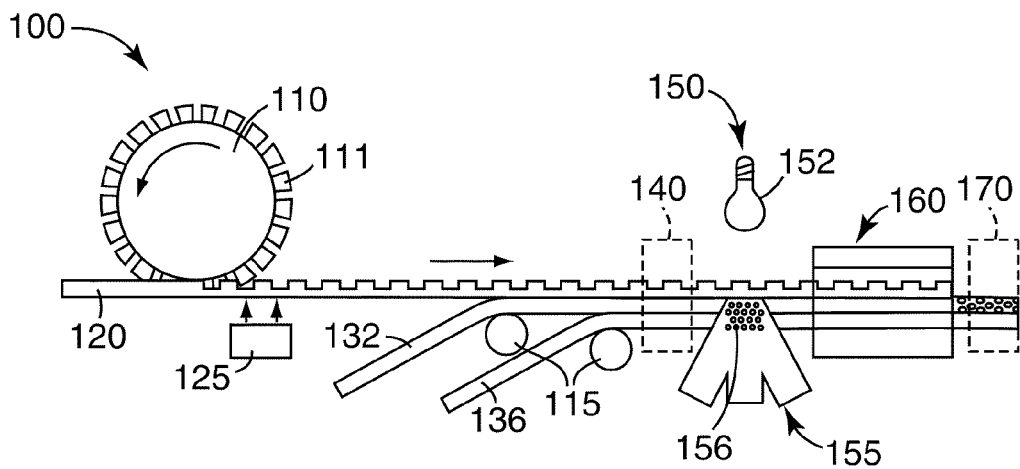
FIG. 1 is a schematic view of a system for continuously fabricating three-dimensional (3D) structures having micron or submicron features according to an aspect of the invention.

An exemplary fabrication system 100 utilized to perform the continuous fabrication of 3D structures having micron and submicron features is shown in FIG. 1. The fabrication system 100 includes a master drum 110, having a relief pattern formed thereon which is imparted onto a phase mask film 120. A set of rollers 115, or similar equipment, can be used to introduce additional layers, such as photoresist layer 132 and substrate 136 to form a continuous relief structured material 140. System 100 further includes an illumination source 150 that comprises a UV lamp or laser 152 that generates, in combination with the phase mask film, a multi-beam interference pattern 155 that can be used to form the micron and submicron structures in the photoresist layer. A development or post exposure stage 160 is also provided to provide post-exposure processing to the continuous relief structured material 140. In operation, the system 100 employs a moving stage, such as is conventionally employed in web-based manufacturing, to provide continuous manufacturing of the 3D structures.

The continuous relief structured material 140 is provided as the base material from which the eventual 3D structured material is formed. By "continuous material" it is meant a material having a length (L) many times larger than its width (w). For example, continuous relief structured material 140 can be many meters in length (i.e., including hundreds or thousands of meters in length), while the width can be from about 1 to about 2 meters (e.g., a 100 to 1 ratio).

Figure 2A:
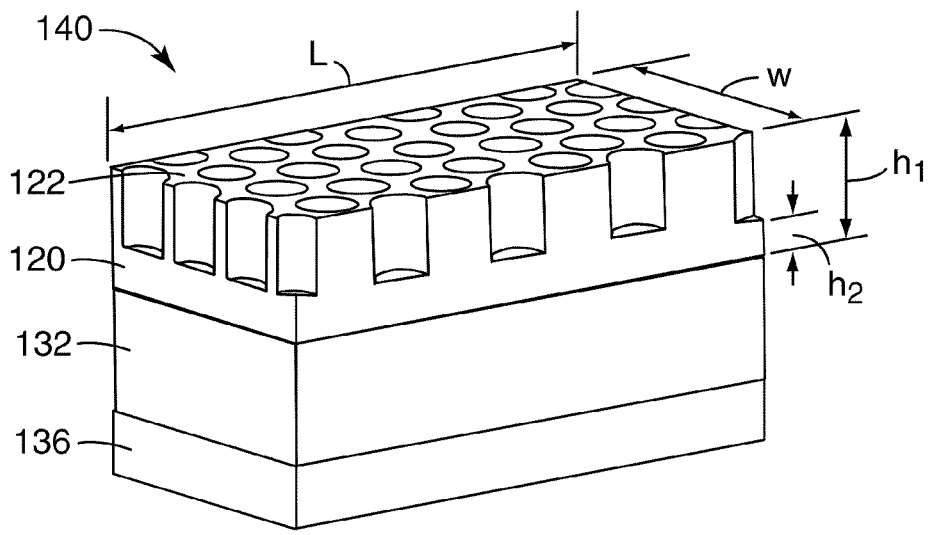
FIG. 2A is an isometric view of an exemplary continuous relief structured material prior to exposure and development according to an aspect of the invention.

In a preferred aspect, as is shown in FIG. 2A, the relief structured material 140 includes a phase mask film layer 120, a photoresist layer 132 and a backing layer or substrate 136. Optionally, interstitial anti-reflection layers, wavelength filter layers, release layers, tie layers, or support layers can also be included. In an exemplary aspect, the relief structured material 140 is a stacked material having photoresist layer 132 interposed between the phase mask film 120 and backing or substrate layer 136.

In an alternative aspect, the relief structured material 140 can comprise a phase mask film layer 120 and a photoresist layer 132, omitting the separate substrate layer 136. In this implementation, the phase mask film layer can provide sufficient structural support for the relief structured material 140 and the resultant 3D structured material.

Phase mask film layer 120 is formed from a conventional web-type material, preferably a polymer material, such as thermoplastic polymers or thermosetting polymers known to those skilled in the art. Thermoplastic polymers can include materials that soften or melt above room temperature but that are rigid and can hold structure when at or below room temperature. Some thermoplastic polymers that can be utilized to produce replicas include, for example, polymethylmethacrylate (PMMA), polycarbonate (PC), polystyrene (PS), polyvinylchloride (PVC), polypropylene (PP), polyethylene terephtalate (PET), polyetheretherketone (PEEK), polyamide (PA), polysulfone (PSU, very brittle polymer), polyvinylidenefluoride (PVDF), and polyoxymethylene (POM). Thermosetting polymers that can be utilized include polysiloxanes (such as polydimethyldisiloxane (PDMS)), polyimides (made from curing of polyamic acid), and urethane acrylates.

This material can be a water or alcohol soluble material, such as polyvinyl alcohol (PVA). In addition, phase mask film layer 120 can eventually include an upper surface having a plurality of relief structures 122 (formed using the processes described below in further detail). The relief structures 122 can span most of, or all of, the entire width (w) of the phase mask film layer 120 and have varying heights (h1, h2) to provide suitable phase mask characteristics when exposed to an illumination source. For example, the features can have a periodicity from about 10 nm to about several microns (for example, less than or equal to 10 microns), and feature sizes on a similar scale. For operational purposes, the phase mask film layer 120 may be provided on a carrier film (preferably of the same material) or a removable liner.

In an alternative aspect, layer 122 can be constructed as an amplitude mask, where the relief features can comprise periodic metal lines or grids that can form a diffraction pattern when exposed to a light or other radiation source. As such, layer 122 can be at least partially transmissive or fully transmissive.

In an exemplary aspect, the relief structured phase mask film layer 120 can be generated as part of the fabrication system 100. As shown in FIG. 1, master drum 110 can be utilized to form the relief structures 122 onto phase mask film layer 120. The relief structures are formed on a drum surface that can comprise a metal (e.g., Ni, Cu, Al), a polymer, an oxide, diamond, and diamond-like films. In one aspect, the drum surface material can be treated.

It can be advantageous to apply a release coating to the surface of the master drum before adding a replication material. If the drum surface is made from $SiO_2$, SiN, or other inorganic or polymeric materials, the mold can be coated with a fluorosilane release agent such as, for example, trimethylchlorosilane or fluorinated siloxanes such as those disclosed in U.S. Pat. No. 5,851,674 (Pellerite et al.). Also useful for this purpose are hexafluoropolyprolylene oxide derivatives such as those disclosed in U.S. Pat. No. 7,173,778 (Jing et al.). These disclosures are incorporated by reference in their entirety.

If the drum surface is metallized, it can also be advantageous to apply a release agent on the metallized article to enhance the release of the polymers that form the relief structures. For example, the structured drum surface can be coated with a release layer such as a fluorinated phosphonic acid, as disclosed in U.S. Pat. No. 6,824,882 (Boardman et al.) or perfluoropolyether amide-linked phosphonates such as those disclosed in U.S. Pat. Publication No. 2005/0048288 (Flynn et al). It is also contemplated that the structured drum surface can be protected by coating with diamond-like glass, as is disclosed, for example, in U.S. Pat. No. 6,696,157 (David et al.). Other suitable materials that can be used as a release layer are discussed in copending application, U.S. Ser. No. 11/766,477 (Zhang et al.). Each of the aforementioned disclosures is incorporated by reference herein in its entirety.

To form the structures, one or more of the following techniques can be utilized: diamond turning, laser ablation, optical lithography, focused ion beam, and e-beam lithography. In a preferred aspect, the master drum 110 includes a pattern of relief structures 111 that can be formed using a conventional diamond turning or laser ablation technique. During operation, the master drum 110 continuously contacts the phase mask film layer 120 to replicate the relief structure pattern onto the phase mask film layer 120. In alternative aspects, as would be apparent to one of skill in the art given the present description, any of a number of different replication techniques can be utilized, including casting and cooling (for a thermoplastic), casting and curing (for a thermoset; including a photocure). Casting can include any of the following techniques: extrusion, dipcoating, knife coating, roll coating, gravure coating, roll coating, lithographic coating, printing, and ink jet coating.

The master drum 110 can thus transfer the relief structure pattern to the phase mask film layer 120 to imprint the phase mask film layer 120 with a suitable 2-dimensional pattern of relief structures 122. The master drum 110 can thus directly control the dimensions of the eventual 3D structures and can enable continuous fabrication using a continuous phase mask film. Because a replication method is used, an accurate pattern and position of the structure is maintained in the film.

Figure 3:
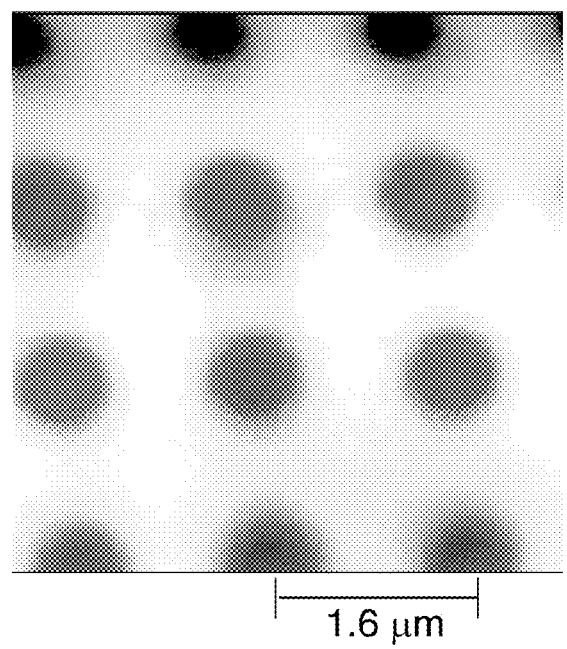
FIG. 3 is an AFM (atomic force microscope) image of an exemplary experimental relief structure pattern formed on a phase mask film layer according to an aspect of the invention.

For example, FIG. 3 shows an AFM (atomic force microscope) image of an experimental relief structure pattern formed on a phase mask film layer, where the relief structures have an X-Y spacing of about 1.6 microns, and a depth of about 0.5 microns (h1-h2). In a preferred aspect, the array periodicity of the relief structures is kept constant. In an alternative aspect, the periodicity of the relief structures can be varied, depending on the type of exposure that are suitable for a particular application.

As mentioned above, photoresist layer 132 and substrate 136 are introduced to form the continuous relief structured material 140. These additional layers can be introduced via a conventional coating process (e.g., by dye coating) or a conventional lamination process. Layer thickness control techniques can be utilized depending on the type of photoresist material being used and/or the geometry of the structure required.

Photoresist layer 132 can comprise a photosensitive material, such as a conventional photoresist material. In alternative aspects, the photoresist can comprise a negative photoresist, such as UVN 30 (available from Rohm and Haas Electronic Materials, Marlborough, Mass.) and SU-8 (available from MicroChem Corp.), or a positive photoresist, such as UV5 (available from Rohm and Haas Electronic Materials) and Shipley 1813 photoresist (Rohm and Haas Electronic Materials). In one example, a negative photoresist that can be utilized is an ORMOCER® resist (available from Micro Resist Technology). In exemplary aspects, the photoresist layer can be introduced using one or more of the following techniques dip-coating, knife coating, roll coating, gravure coating, lithographic coating, and ink jet coating.

In a preferred aspect, the photoresist layer 132 has a thickness of about 10 nm to about 100 microns. A suitable thickness can depend on factors such as material type, exposure type, and exposure levels, as would be understood by one of skill in the art, given the present description.

In preferred aspects, a substrate layer 136 can be included and can be formed from a conventional web-type backing/support polymer material, such as polyester (both PET and PEN), polyimide, polycarbonate, or polystyrene. In alternative aspects, the substrate can include metal foil materials, such as, stainless steel, other steels, aluminum, copper, or paper or woven or nonwoven fabric materials. For all of the above substrate materials, they can further include a coated surface.

In a preferred aspect, the substrate layer 136 has sufficient strength and/or flexibility, and can have a thickness of about 10 microns to about several (10 or less) millimeters. In an alternative aspect, substrate 136 can comprise a rigid material, such as glass.

In addition, in alternative aspects, the additional layers can be introduced to form the continuous relief structured material 140 either before or after the imprinting of the phase mask structure. Optionally, fabrication system 100 can further include a curing source 125 disposed near the master drum 110. The curing source 125 can expose and cure (either thermally or through UV exposure, depending on the material composition of layer 120) the phase mask film layer 120 to finally form relief structures 122. In the case where the multilayer stack is created prior to the imprinting process, and a UV curing process is subsequently used, the curing wavelength should be carefully selected in order to minimize effects to the photoresist layer.

After the continuous relief structured material 140 is formed, the structured material 140 is exposed to radiation via an exposure source 150. In a preferred aspect, the exposure source 150 comprises a radiation source, preferably a partially coherent or coherent light source. In one aspect, an inexpensive light source can be used, such as a UV lamp 152, even with partial coherence (where the temporal coherence length is longer than the dimension of the structure height of the phase mask film layer 120). For example, a collimated Mercury lamp with a color filter may be used. Alternatively, one or more LEDs, laser diodes, or a laser can be utilized as exposure source 150. In a further alternative, an infrared (IR) source can be used. In this IR source alternative example, the photoresist layer 132 can include a dopant to facilitate a 2-photon effect within the photoresist to cause a photo-induced reaction. In this alternative example, the thickness of the photoresist layer 132 may be increased.

Figure 2B:
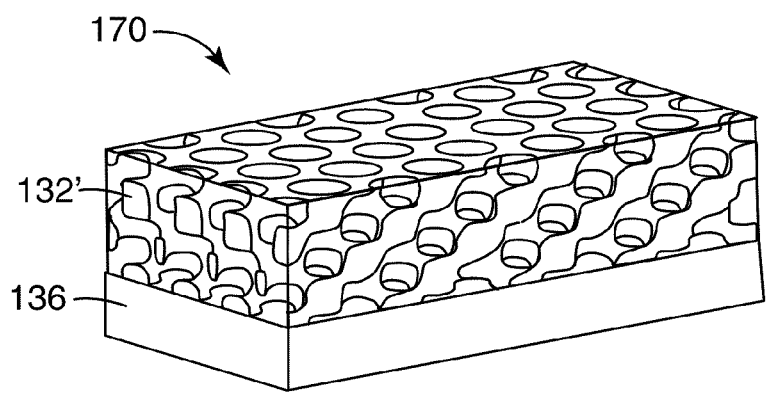
FIG. 2B is an isometric view of another exemplary continuous relief structured material after exposure and development according to an aspect of the invention.

The exposure source 150 creates an illumination beam that is incident upon a substantial portion of the phase mask film layer 120 and exposes the structured material therethrough. The interaction of the exposure illumination with the phase mask film layer creates an optical interference pattern within the photoresist layer 132. More specifically, this exposure generates a 3-dimensional light intensity pattern 155 that is incident on the photoresist layer 132. The exposure to the photoresist layer 132 by the 3-dimensional light intensity pattern 155 creates a structured photoresist layer 132' having micron and submicron structures with a periodicity or quasi-periodicity in 3 dimensions, such as shown in FIG. 2B. The 3-dimensional light intensity pattern 155 is explained in further detail below.

After exposure, the exposed structured material 140 passes to a development station 160. Optionally, a heating element (not shown) can also be used to heat the structured material prior to the development stage in order to complete the reaction in the photoresist layer.

In a preferred aspect, the exposed structured material 140 is subjected to a wet development process, which can dissolve the phase mask film layer 120 and fully form the structured photoresist layer 132' having micron and submicron features (by removing exposed/unexposed portions of the photoresist, depending on the type of photoresist material utilized). The phase mask film layer 120 can be removed from the structured material before, during, or after development. In an alternative aspect, instead of removing the phase mask layer before or during development, a deposition step can be utilized, where (after exposure), an additional layer of material is deposited on the structure to cover the phase mask layer. This material preferably is of the same index of refraction as the phase mask layer and can remain part of the structure after development.

In operation, the development station can include solution dispensing equipment, formed over the fabrication line to provide a spray-type development process. For example, a water-based developer can be utilized, such as tetramethylammonium hydroxide, for example the Microposit MF-319, MF-321, MF-322 or CD-26 available from Rohm and Haas Electronic Materials. Other conventional developer material can be utilized (e.g., for a SU-8 material, one can use a SU-8 developer from Microchem Corp.). In an alternative aspect, the phase mask layer 120 can be peeled off or delaminated from the photosensitive layer 132' before development, such as through the use of a release coating.

The development can be carried out in a manner that minimizes or prevents collapse of the photodefined pattern of layer 132, which can result from stresses induced by surface tension of the solvents during drying. In one alternative aspect, an extraction station can be provided post development. Thus, in order to minimize drying stress, the solvent used to develop the structure can be removed by $CO_2$ supercritical extraction (see, for example, C. J. Brinker and G. W. Scherer, *Sol-Gel Science*, Academic Press, New York, pp. 501-505 (1990)). The details of this supercritical drying method are described in further detail in US 2005/0124712, incorporated by reference herein in its entirety.

After removal of either the reacted or the non-reacted portion of the photoreactive composition, the resulting void space of the periodic structure can, if desired, be partially or fully filled with one or more materials. Suitable materials include, for example, semiconductors (organic or inorganic), metals (for example, tungsten and noble metals such as silver), or other materials exhibiting a desired property. Preferably, the material is a high refractive index material (for example, having a refractive index greater than about two) such as an inorganic semiconductor. Examples of useful inorganic semiconductors include silicon, germanium, selenium, gallium arsenide, indium phosphide, ternary compounds such as gallium indium phosphide and gallium indium arsenide, and the like. Doped semiconductors can also be used (for example, silicon can be doped with boron to create an n-type semiconductor).

The resultant structure 170 is shown in FIG. 2B, where the developed photoresist layer 132' includes a plurality of 3D structures having micron and submicron features.

In an alternative embodiment, the fabrication system can be altered such that the phase mask layer can be disposed on the bottom of the structured material 140. Also, the exposure system 150 can be disposed below the fabrication line, with light exposure being transmitted through the substrate/backing film layer 136 and phase mask layer from below.

In a further alternative aspect, the phase mask layer can be maintained in place after the exposure step, where it can be utilized as an alignment tool for further processing. For example, defects can be generated in the 3D periodic structure by exposing it to laser or e-beam radiation.

As mentioned above, the exposure source 150 creates an illumination beam that is incident upon a substantial portion of the phase mask film layer 120 and exposes the structured material. This exposure generates a 3-dimensional light intensity pattern 155 that is incident on the photoresist layer 132. This multi-beam interference pattern is induced by the radiation exposure of the relief structure and generates intensity pattern 155. The 3-dimensional light intensity pattern 155 corresponds to a density of feature patterns formed as a function of depth controlled by the light source and the lateral, longitudinal and depth direction components of the relief structure of the phase mask film. The multi-beam, interference pattern 155 includes a perpendicular (with respect to the surface of the photoresist layer), zero-order electromagnetic field component and angled higher-order field components, both in the plane of the figure (as shown) and in/out of the plane of the figure (not shown).

Figure 4:
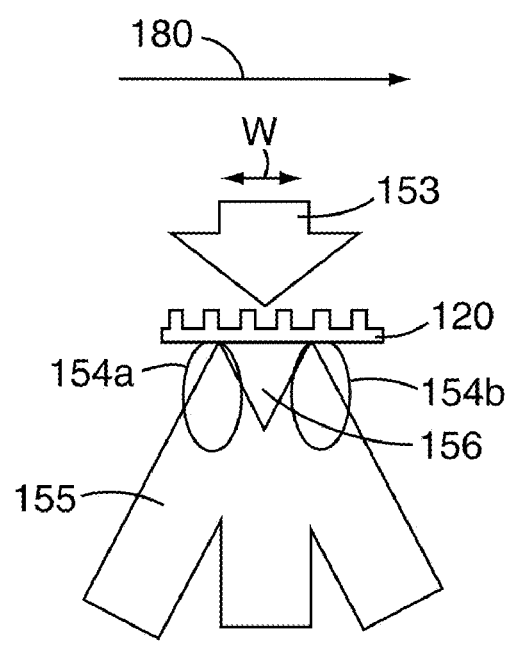
FIG. 4 is a schematic view of an exposed continuous relief structured material and a 3-dimensional light intensity pattern according to an aspect of the invention.

In addition, in operation, the exposed material is moving, see e.g., FIG. 4 (direction arrow 180). Due to the finite size of the light source (width="W"), some deleterious edge effects corresponding to light averaging and contrast reduction will occur as the structure 140 is traveling through the finite light beam 153. As schematically shown in FIG. 4, a point of the exposed photoresist layer travels through the first edge 154a where only one beam component is present or only two beam components are crossing. The exposed photoresist layer also travels through the main 3D interference pattern 156. Then, the exposed photoresist layer travels through another edge 154b. If not controlled, this type of operational exposure may create a dose exposure contrast reduction that can result in dis-symmetry between the patterned structure directions, or (possibly) a complete wash-out of the structure. For example, by increasing the width (W) of the exposure beam, the exposure dose contribution coming from the edge widths set by the intersecting angle are reduced. Also, the non-linear response of the photoresist can be adjusted and used to further reduce the impact of the exposure dose due to the non-modulated or partially modulated light of the edges. Another approach to reduce the amount of exposure of the non-modulated or partially modulated light in the edge area can be to place the photosensitive layer as close as possible to the phase mask and reduce the amount of separation of the different orders traveling at different angles.

Overall, in a preferred aspect, the web process approach allows for continuous production of 3D structures having micron and submicron features with a high tolerance for fabrication error. As such, typical alignment issues associated with optical lithography methods are reduced. In one exemplary aspect, these 3D structures having micron and submicron features can be utilized in organic light emitting diode (OLED) applications. Other applications can include photonics, chemical sensing, catalytic support, data storage, nano- and micro-fluidic networks, and tissue engineering.

Experiments

In a first experiment, a structured phase mask film (formed from a polydimethylsiloxane (PDMS) material) was prepared and laminated on a substrate (both glass and polyethyleneterephthalate (PET) films were utilized) that was coated with a photoresist layer. A first photoresist layer was formed from a positive resist material (specifically a MICROPOSIT S1813 photoresist, available from Rohm and Haas Electronic Materials, Philadelphia, Pa.), and was dip-coated to achieve a thickness of about 5 microns. The PDMS film pattern was prepared by imprinting with a Nickel mold. The AFM image of the prepared phase mask film layer structure is shown in FIG. 3. The prepared phase mask film layer has standing relief elements with a periodic 2D hole structure with a 1.6-micron period and 0.5 micron depth, with a total thickness of about 3 mm. The exposure source was a UV laser, specifically a Sabre FreD Laser, available from Coherent Inc., Santa Clara, Calif. having an output wavelength of about 351 nm, and with a power of about 1 W. The multilayer material was kept stationary during the exposure.

Figure 5A:
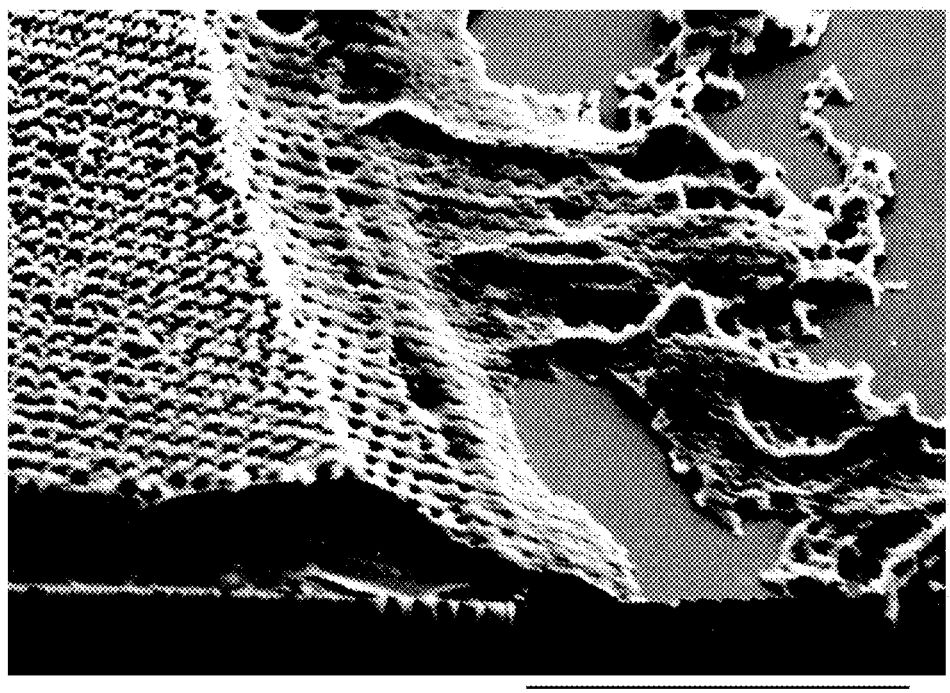
FIGS. 5A and 5B are scanning electron microscope (SEM) images of exemplary first and second experimental samples of formed 3D structures.

A first experimental sample is shown in FIG. 5A, which provides a scanning electron microscope (SEM) image of the formed 3D structure. The image for this first sample structure was taken at the edge of the coating where a thicker resist layer existed. The exposed structure displays several different levels of structures throughout the depth of the sample. In this example, the holes have a size of about 1 micron size in diameter.

Figure 5B:
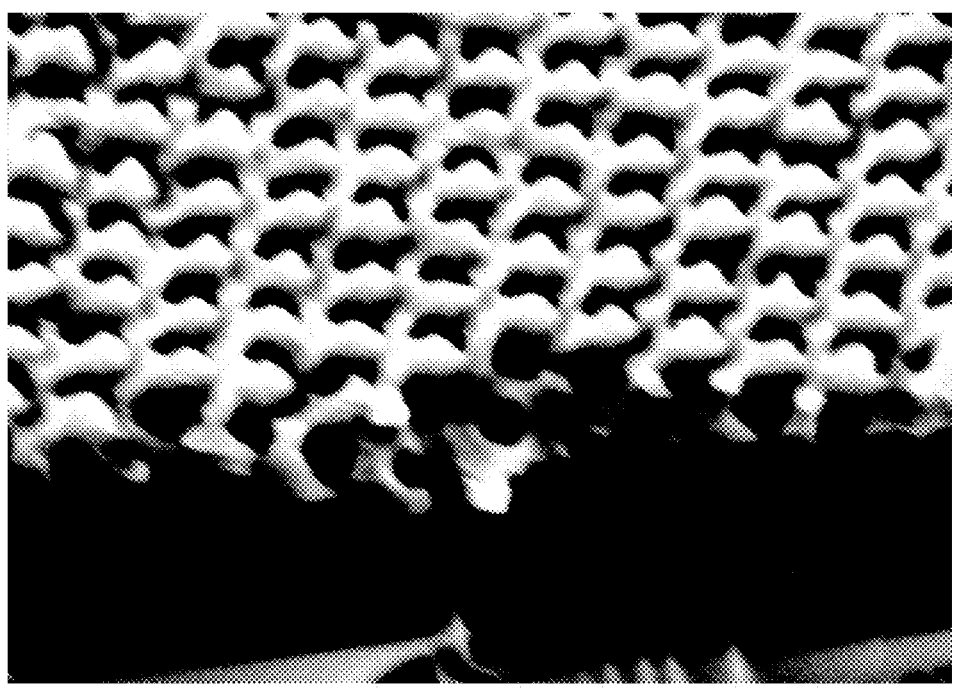

In a second experiment, the conditions were the same as those above, except that the photoresist layer was formed from an epoxy-based negative resist material (specifically a SU-8 photoresist, available from MicroChem, Newton, Mass.). FIG. 5B shows an SEM image of the second experimental sample showing a two-layer structure of embedded void spheres.

In another experiment, a glass slide was coated with an anti-reflective coating ("ARC"—specifically, an XLT ARC from Brewer Science Inc., Rolla, Mo.). A photoresist was disposed on the ARC. In this case, a positive resist material (specifically a S1813 photoresist, available from Rohm and Haas Electronic Materials, Philadelphia, Pa.) was utilized, and was dip-coated (at about 3 mm/s speed). The ARC thickness was estimated to be slightly thicker than 0.5 micron and the resist thickness was estimated to be about 15 microns. A structured phase mask film (formed from a polydimethylsiloxane (PDMS) material) was prepared and disposed onto the resist/ARC/substrate with the relief structures standing up. The PDMS film pattern was prepared by imprinting with a Nickel mold, similar to that described above. The multilayer material was mounted on a translation stage. The stage/material was moved at a rate of about 60 mm/s crossing a finite collimated 351 nm laser beam with a Gaussian shape (3.2 mm diameter). Lines with a width of several millimeters and several centimeter lengths were drawn. The light intensity was varied from 60 mW (first trial) to 70 mW (second trial). After exposure, the samples were developed in a MICROPOSIT MF-319 developer available from Rohm and Haas Electronic Materials, Philadelphia, Pa. Developing times from about 50 seconds (second trial) to about 90 seconds (first trial) were used.

Figure 6A:
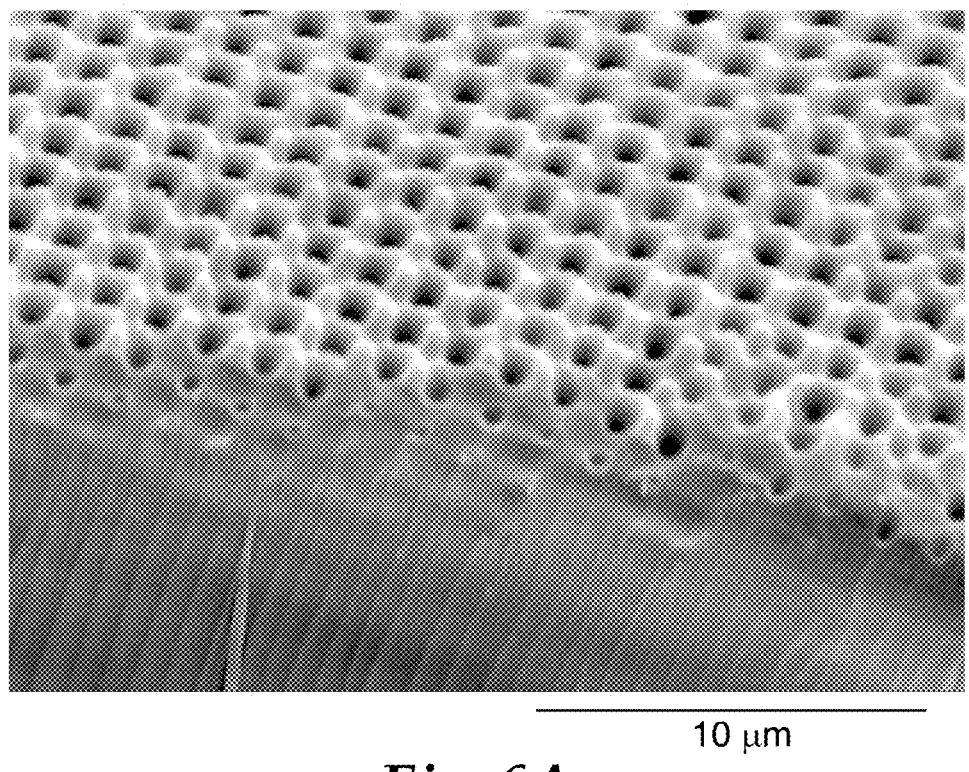
FIGS. 6A and 6B are scanning electron microscope (SEM) images of exemplary third and fourth experimental samples of formed 3D structures.
Figure 6B:
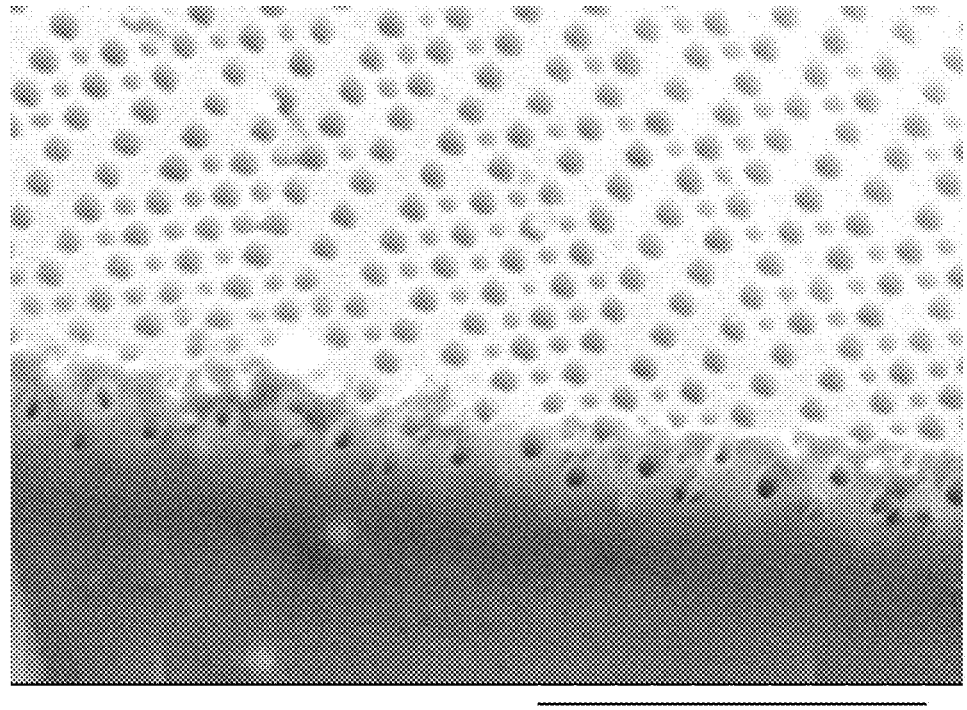

Examples of structures obtained from these experiments are showed in FIG. 6A (first trial) and FIG. 6B (second trial). Periodicity in the vertical dimension indicates a 3D structure observed in the cleaved edge. In FIG. 6A, a holes-and-polls structure is observed also indicative of periodicity in the third dimension (i.e., depth-wise). FIG. 6B also shows variations from the original 2D mold pattern in the first plane also indicating a 3D exposure pattern. Such behavior is likely due to the non-uniformity of the phase-mask layer.

Although the present invention has been described with reference to preferred embodiments, workers skilled in the art will recognize that changes may be made in form and detail without departing from the scope of the invention.

I claim:

1. A method of fabricating three-dimensional (3D) structures having micron or submicron features, comprising:
   providing a continuously-formed relief structured material, the relief structured material having a first layer comprising a material having a pattern of relief structures formed on a first surface thereof, a second layer comprising a photosensitive material;
   exposing the relief structured material to radiation through the first layer, wherein the pattern of relief structures formed on the first surface of the first layer generates a three-dimensional light intensity pattern of the radiation that is incident on the second layer; and
   developing the exposed relief structure material, wherein the developed second layer comprises a plurality of 3D structures having micron or submicron features.

2. The method according to claim 1, further comprising: continuously forming a pattern of relief structures on the first layer of the relief structured material.

3. The method according to claim 2, wherein a rotating master drum having a pattern of relief structures continuously contacts an unformed surface of the first layer and replicates the relief structures of the master drum onto the surface of the first layer.

4. The method according to claim 1, wherein the relief structured material further comprises a substrate to support the second layer, wherein the second layer is laminated to the first layer and wherein the substrate is laminated to the second layer.

5. The method according to claim 1, further comprising: curing the first layer prior to the exposing step.

6. The method according to claim 1, comprising heating the structured material prior to the developing step.

7. The method according to claim 1, further comprising performing a super critical drying of the developed second layer.

8. The method according to claim 1, further comprising: at least partially filling resulting void spaces of the periodic structure with one or more filling materials.

9. The method according to claim 1, further comprising: removing the first layer after the exposing step.

10. The method according to claim 1, further comprising: depositing a covering layer to cover the first layer after exposure, wherein the covering layer has an index of refraction about the same as an index of refraction of the first layer.

* * * * *